United States Patent
Geerlings

(10) Patent No.: US 10,271,278 B2
(45) Date of Patent: Apr. 23, 2019

(54) ACTIVATION OF WIRELESS MODULE UTILIZING MAGNETIC FIELD DATA

(71) Applicant: Gentex Corporation, Zeeland, MI (US)

(72) Inventor: Steven L. Geerlings, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 15/816,091

(22) Filed: Nov. 17, 2017

(65) Prior Publication Data
US 2018/0184376 A1    Jun. 28, 2018

Related U.S. Application Data

(60) Provisional application No. 62/438,026, filed on Dec. 22, 2016.

(51) Int. Cl.
| | |
|---|---|
| *H04B 1/04* | (2006.01) |
| *H04W 52/02* | (2009.01) |
| *G01R 33/02* | (2006.01) |
| *G07B 15/06* | (2011.01) |

(52) U.S. Cl.
CPC ........ *H04W 52/0225* (2013.01); *G01R 33/02* (2013.01); *G07B 15/063* (2013.01); *H04W 52/0229* (2013.01); *H04W 52/0235* (2013.01); *H04W 52/0274* (2013.01)

(58) Field of Classification Search
CPC . G04W 52/0225; G01R 33/02; G07B 15/063; H04W 52/0274
USPC ...................................................... 455/127.5
See application file for complete search history.

(56) References Cited

U.S. PATENT DOCUMENTS

| | | | |
|---|---|---|---|
| 6,023,229 | A | 2/2000 | Bugno et al. |
| 6,140,933 | A | 10/2000 | Bugno et al. |
| 6,968,273 | B2 | 11/2005 | Ockerse et al. |
| 7,149,627 | B2 | 12/2006 | Ockerse et al. |
| 2006/0025834 | A1 | 2/2006 | Von Arx et al. |
| 2006/0125603 | A1* | 6/2006 | Nahear .............. G06K 19/0723 340/10.5 |

(Continued)

FOREIGN PATENT DOCUMENTS

KR        101629791 B1    6/2016

OTHER PUBLICATIONS

International Search Report and Written Opinion of the International Searching Authority, dated Mar. 15, 2018, for International Application No. PCT/US2017/062200 filed Nov. 17, 2017, 9 pages.

*Primary Examiner* — Sanh D Phu
(74) *Attorney, Agent, or Firm* — Price Heneveld LLP; Bradley D. Johnson

(57) ABSTRACT

A wireless communication module is disclosed. The wireless communication module comprises a magnetic sensor configured to detect magnetic field data and a communication circuit. A controller is in communication with the magnetic sensor and the communication circuit. The controller is configured to monitor the magnetic field data and compare the magnetic field data to a first predetermined threshold. In response the magnetic field data exceeding the first threshold, the controller is configured to output an activation signal to the communication circuit. The communication circuit is configured to enter an active state in response to receiving the activation signal.

17 Claims, 3 Drawing Sheets

(56) References Cited

U.S. PATENT DOCUMENTS

2009/0121898 A1 5/2009 Jia et al.
2014/0342671 A1* 11/2014 Kim ...................... H04W 4/02
455/41.3

\* cited by examiner

ACTIVATION OF WIRELESS MODULE UTILIZING MAGNETIC FIELD DATA

CROSS-REFERENCE TO RELATED APPLICATION

This application claims priority to and the benefit under 35 U.S.C. § 119(e) of U.S. Provisional Patent Application No. 62/438,026, filed on Dec. 22, 2016, entitled "ACTIVATION OF WIRELESS COMMUNICATION MODULE UTILIZING COMPASS DATA," the entire disclosure of which is hereby incorporated herein by reference.

TECHNOLOGICAL FIELD

The disclosure relates to a wireless module comprising a magnetic sensor.

BRIEF SUMMARY

According to one aspect of the disclosure, a wireless communication module is disclosed. The wireless communication module comprises a magnetic sensor configured to capture magnetic field data and a communication circuit. A controller is in communication with the magnetic sensor and the communication circuit. The controller is configured to monitor the magnetic field data and compare the magnetic field data to a first predetermined threshold. In response to the magnetic field data exceeding the first threshold, the controller is configured to output an activation signal to the communication circuit. The communication circuit is configured to enter an active state in response to receiving the activation signal.

According to another aspect of the disclosure, a method for controlling a wireless communication module is disclosed. The method comprises monitoring magnetic field data in a plurality of axes and identifying a change in the magnetic field data. The method continues by comparing the change in the magnetic field to a first predetermined threshold. In response to the change in the magnetic field data exceeding the first threshold, the method continues by activating a communication circuit to an active state. In the active state, the method further continues by scanning for one or more wireless signals at a frequency.

According to yet another aspect of the disclosure, a wireless communication system for a vehicle is disclosed. The system comprises a magnetic sensor configured to detect magnetic field data in a plurality of axes and a communication circuit. A controller is in communication with the magnetic sensor and the communication circuit. The controller is configured to monitor the magnetic field data and compare a change in the magnetic field data to a first predetermined threshold. In response to a change in the magnetic field data exceeding the first threshold, the controller is configured to output an activation signal to the communication circuit. The communication circuit is configured to enter an active state in response to receiving the activation signal. In the active state, the communication circuit scans for a first wireless signal from an electronic toll reader.

These and other features, advantages, and objects of the present disclosure will be further understood and appreciated by those skilled in the art by reference to the following specification, claims, and appended drawings.

DETAILED DESCRIPTION

Figure 1:
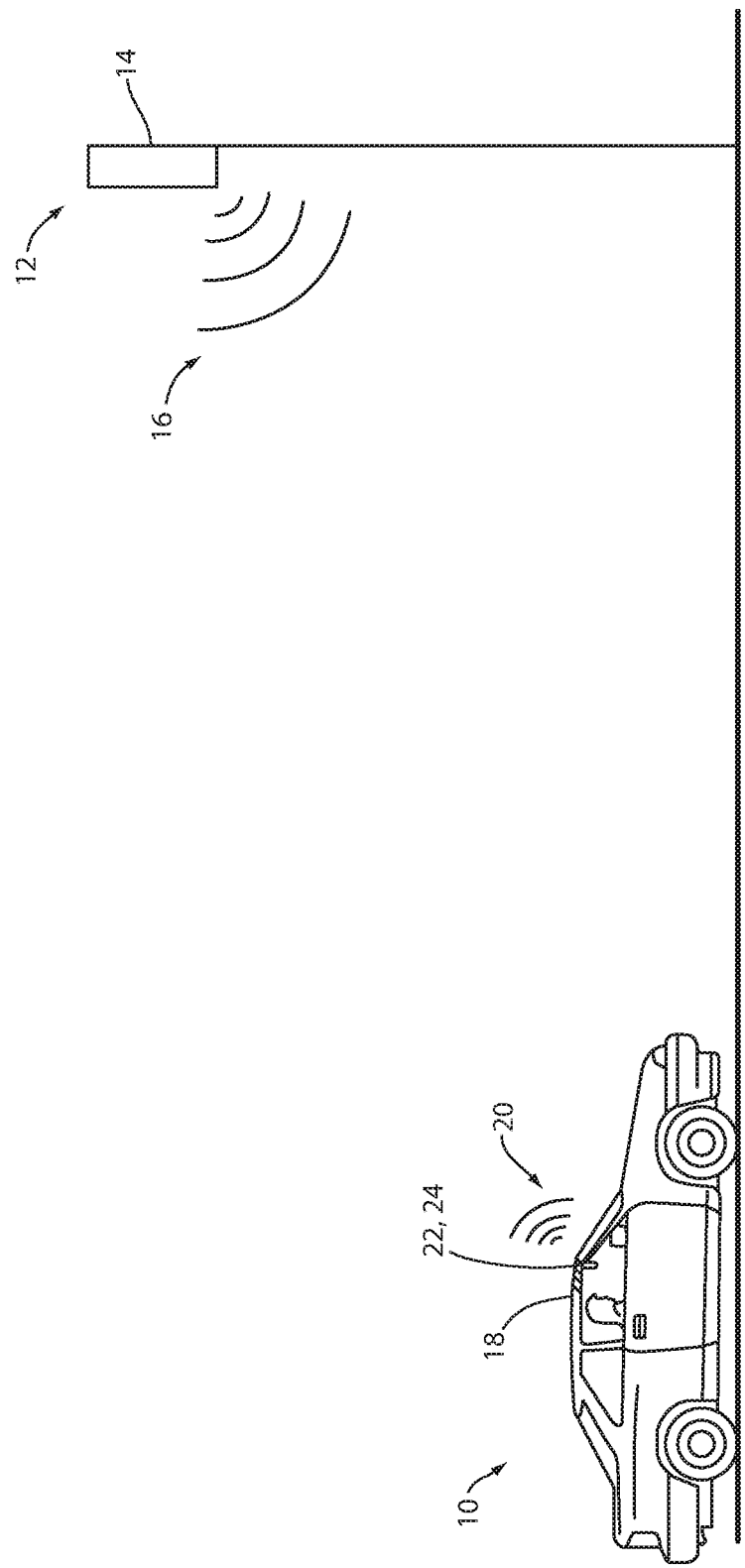
FIG. 1 is a diagram of a vehicle comprising a toll module entering a toll station comprising a toll reader.

For purposes of description herein the terms "upper," "lower," "right," "left," "rear," "front," "vertical," "horizontal," and derivatives thereof shall relate to the device as oriented in FIG. 1. However, it is to be understood that the device may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring to FIG. 1, a vehicle 10 is shown approaching a toll station 12, comprising a toll reader 14. The toll reader 14 may be configured to emit a first wireless signal 16 configured to activate a toll module 18 of the vehicle 10. In this way, the toll module 18 may identify a proximity to the toll station 12 and broadcast an identification code via a second wireless signal 20. In response to receiving the second wireless signal 20, the toll reader 14 may record the identification code and apply a toll or fee to an account associated with the vehicle 10.

In order to identify a timing to emit the second wireless signal 20, the toll module 18 may comprise a communication circuit (e.g. a transceiver circuit) configured to monitor for the first wireless signal 16. However, monitoring for the first wireless signal 16 may require that the toll module 18 remain active. Maintaining the activation or active condition of the toll module 18 may result in power consumption throughout the lifetime of the toll module 18. Such power consumption may be particularly detrimental for embodiments wherein the toll module 18 utilizes battery power to sustain operation. Accordingly, the disclosure may provide for a magnetic sensor 24 that may be configured to selectively activate the toll module 18 in an active state and a dormant state to preserve battery life and limit the power consumption.

In an exemplary embodiment, the magnetic sensor 24 may be integrated in the toll module 18. In some embodiments, the magnetic sensor 24 may be integrated in a vehicular device 22, which may be in communication with the toll module 18. The vehicular device 22 may correspond to a compass display, vehicle mirror, display mirror, infotainment system, and various other devices in the vehicle that may utilize a magnetic sensor. In embodiments wherein the magnetic sensor 24 is integrated in the toll module 18, the magnetic sensor 24 may be activated throughout a battery life of the toll module 18 and provide for the toll module 18 to selectively enter an active state and a dormant state. The toll module 18 may selectively enter the active state or the dormant state based on a detection in a change in magnitude of one or more axes of magnetic field data detected by the magnetic sensor 24. In this way, the toll module 18 may preserve energy that may otherwise be expended due to operation of the communication circuit monitoring for the first wireless signal 16. The energy may be preserved by monitoring the magnetic sensor 24 in a comparably low energy process.

The magnetic sensor 24 may be configured to measure magnetic field data indicating changes in a magnetic field or magnetic activity about one or more axes. For example, the magnetic sensor 24 may comprise one or more axes of measurement and may utilize a variety of technologies. The magnetic sensor may correspond to a fluxgate magnetometer, magneto-resistive sensor, or other magnetic sensors operable to measure magnetic flux in one or more axes. Accordingly, the magnetic sensor 24 may identify the fluctuations in a magnitude of a magnetic field in response to movement of the vehicle 10 by detecting changes in the magnetic field data.

In some embodiments, the toll module 18 may further comprise a controller. Further details describing the magnetic sensor 24 and the controller are discussed in reference to FIG. 3. The controller 52 may be integrated within the toll module 18 or in communication with the toll module 18 from the vehicular device 22. The controller 52 may be configured to output an activation signal or sleep signal based on the magnetic field data from the magnetic sensor 24. In this way, the controller 52 may be configured to selectively activate the toll module 18 in the active state to begin scanning for the first wireless signal 16. Accordingly, the toll module 18 may be configured to preserve the power supply 56 or battery by utilizing the magnetic sensor 24 to monitor for motion of the vehicle 10. The active state and the dormant state may be controlled based on the magnetic field data from the magnetic sensor 24.

Though particularly described in reference to the toll module 18, the disclosure may provide for similar configurations to be utilized with various wireless communication modules. For example, the controller 52 as described herein may utilize magnetic field data from the magnetic sensor 24 to selectively activate various forms of wireless communication modules, including, but not limited to, wireless payment modules, wireless access modules, wireless security modules, and various other wireless communication devices. Accordingly, the vehicular device 22 may be utilized to selectively activate various devices that may comprise wireless transceivers similar to the toll module 18. Such devices may be configured to communicate with payment stations, access barriers, security systems, and various other systems or devices configured to communicate wirelessly.

Figure 2:
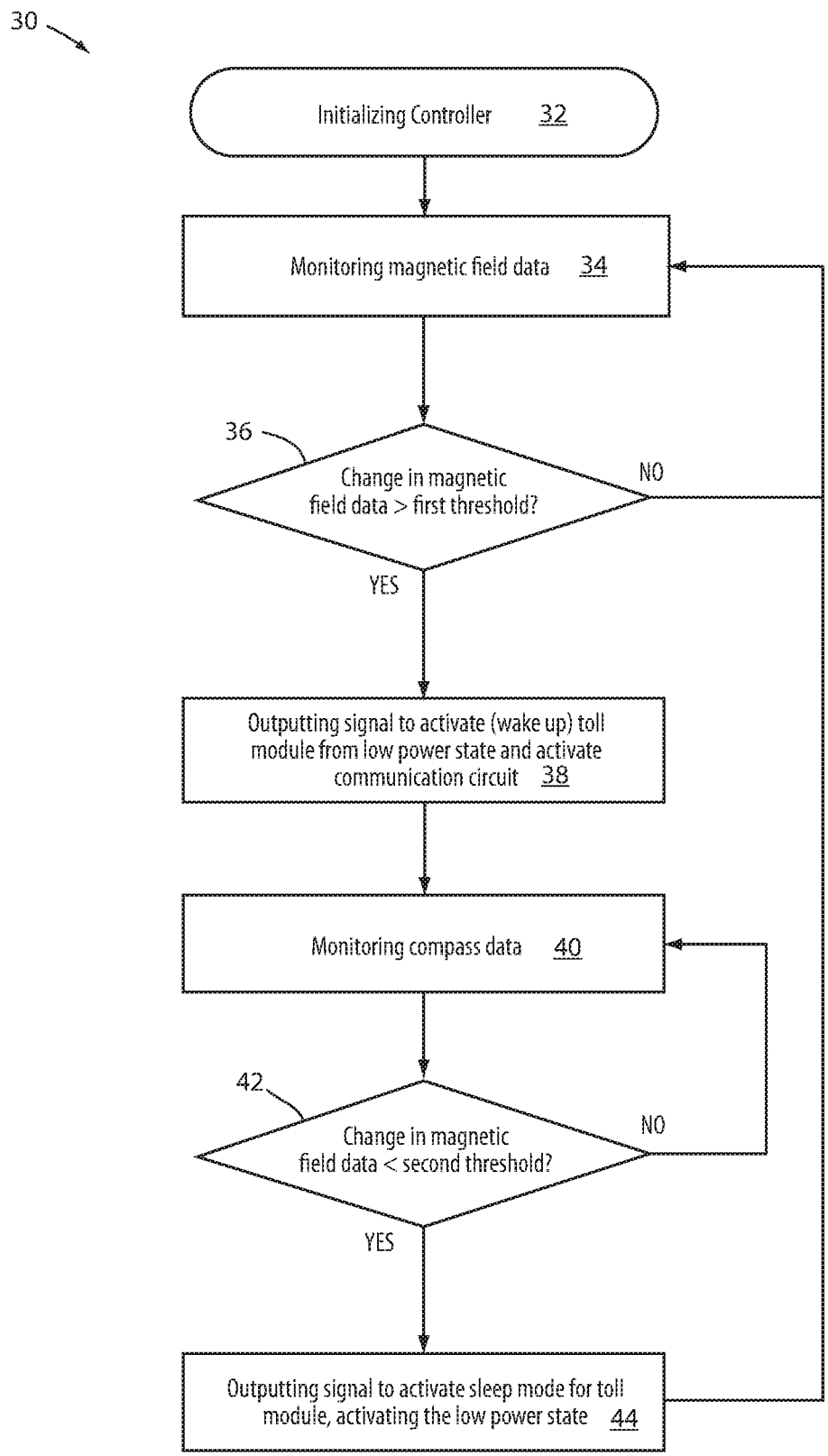
FIG. 2 is a flow chart of a method for controlling a toll module to enter an active mode and a sleep mode.
Figure 3:
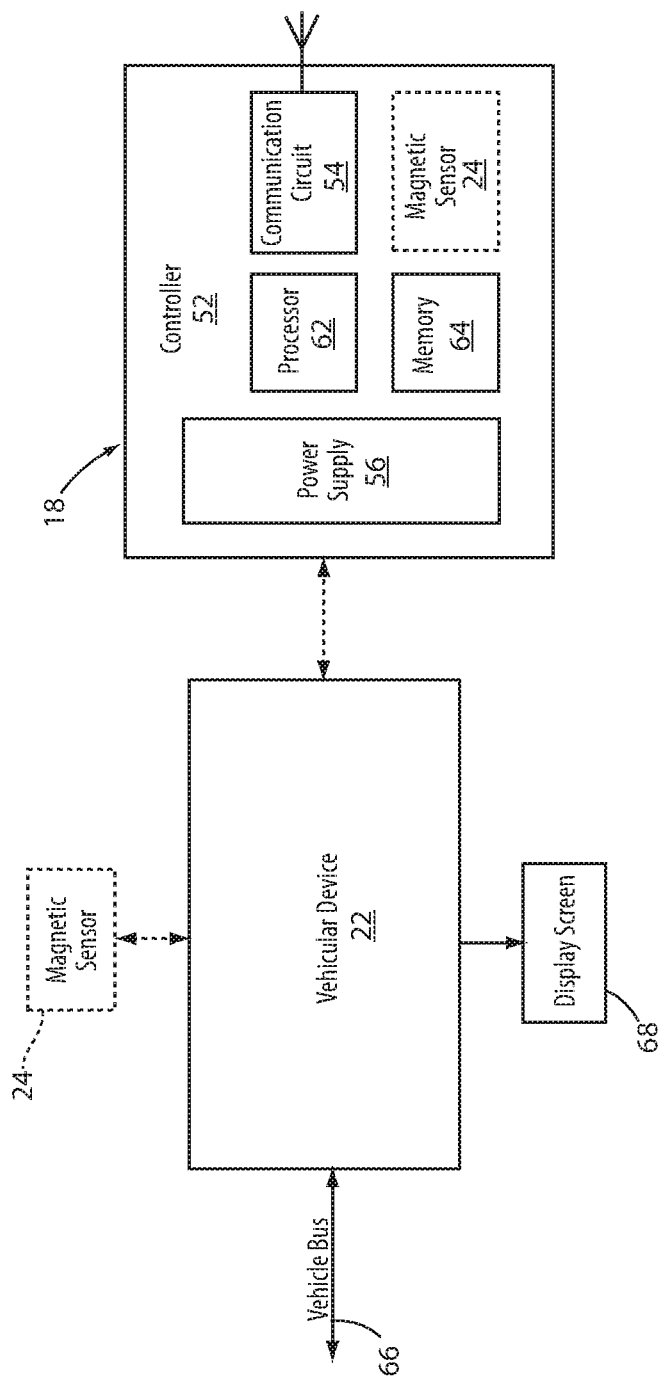
FIG. 3 is a block diagram demonstrating a toll module and vehicular device in accordance with the disclosure.

Referring now to FIG. 2, a method 30 for selectively activating the toll module 18 in the active state and the dormant state based on the magnetic field data from the magnetic sensor 24 is shown. The method 30 may begin by initializing the controller 52 in response to an activation of the vehicle 10 (32). Once initialized, the controller 52 may activate and monitor magnetic field data from the magnetic sensor 24 (34). In some embodiments, the controller 52 may remain initialized in a low power mode or the dormant state throughout the battery life of a power supply of the toll module 18. In such embodiments, the controller 52 may monitor the magnetic field data in the dormant state to preserve stored energy in the battery. The battery may be preserved due to the comparable efficiency and power savings of operating the magnetic sensor 24 relative to the communication circuit 54 of the toll module 18. The controller 52 and the communication circuit 54 are shown in FIG. 3.

The controller 52 may identify motion of the vehicle 10 based on a magnitude change detected in the magnetic field data. The motion of the vehicle may be identified in response to a change in magnitude of the magnetic field data exceeding a first predetermined threshold (36). As described herein, the predetermined threshold may correspond to a change in direction of the vehicle 10, which may be indicated by a relative change in a magnitude of a magnetic field measured by one or more axes of the magnetic sensor 24. For example, the controller 52 may be configured to periodically update a measurement of the magnetic field data (e.g. once every 10 seconds). The controller 52 may then compare the updated magnetic field data with stored magnetic field data previously measured. Based on the comparison, the controller 52 may identify whether the orientation of the vehicle 10 has changed relative to a magnetic field. If a change in the magnetic field data from a first measurement to a second measurement exceeds a predetermined magnitude threshold (e.g. a first threshold), the controller 52 may identify that the vehicle 10 is in motion. In this way, the controller 52 may accurately identify movement of the vehicle 10 and limit false activations that may result due to noise associated with the magnetic field data.

If, in step 36, the controller 52 identifies that the vehicle is not in motion, the controller 52 may return to step 34. If the controller 52 identifies that the change in magnitude of the magnetic field data exceeds the first motion threshold in step 36, the controller 52 may output an activation signal to the communication circuit 54 to enable the toll module 18 to the active state to monitor for a signal from the toll station 12 (38). In the active state, the toll module 18 may control a communication circuit (e.g. a wireless receiver or transceiver) to monitor for the first wireless signal 16. Accordingly, the controller 52 of the vehicular device 22 may selectively activate the toll module 18 in the active state such that the toll module 18 may detect the first wireless signal 16 from the toll station 12.

Once the toll module 18 is controlled to operate in the active state, the controller 52 may continue monitoring the magnetic field data in step 40. Based on the magnetic field data from the magnetic sensor 24, the controller 52 may further determine if the vehicle 10 is still in operation. The operation of the vehicle 10 may be identified in response to a change in magnitude of the magnetic field data exceeding a second predetermined threshold (42). For example, the controller 52 may be configured to periodically update a measurement of the magnetic field data (e.g. once every 30 seconds). The controller 52 may then compare the updated magnetic field data with stored or previously measured magnetic field data. Based on the comparison, the controller 52 may identify whether the orientation of the vehicle 10 has changed relative to a magnetic field. If a change in the magnetic field data from a first measurement to a second measurement is less than a predetermined magnitude threshold (e.g. a second threshold), the controller 52 may identify that the vehicle is idle.

In step 42, if the controller 52 identifies that the vehicle 10 is still in motion, the controller 52 may return to step 40. If the controller 52 identifies that the change in a magnitude of the magnetic field data is less than the second threshold in step 42, the controller 52 may output a sleep signal to the communication circuit 54 to activate a sleep mode for the toll module 18 (44). In the sleep mode, the toll module 18 may control a communication circuit (e.g. a wireless transmitter or transceiver) to power down to conserve energy. In this way, the controller 52 may be configured to improve operation of the toll module 18 by preserving battery life of a power source of the toll module 18.

Referring now to FIG. 3, a block diagram of the toll module 18 is shown. The toll module 18 may comprise the controller 52 in communication with a communication circuit 54 and configured to draw power from a power supply 56. In this configuration, the toll module 18 may operate based on battery power stored in the power supply 56. The controller 52 may be in communication with the magnetic sensor 24 such that the controller 52 may utilize the magnetic field data to selectively activate the toll module 18. As discussed herein, the controller 52 may be configured to control the communication circuit 54 to communicate wirelessly with the toll reader 14 in the active state based on magnetic field data detected by the magnetic sensor 24. The controller 52 may further control the communication circuit 54 to operate in the dormant state to preserve the power supply 56 in response to a sleep signal based on the magnetic field data.

The controller 52 may comprise a processor 62 and a memory 64. The memory 64 may be configured to store one or more instructions to support the processing steps of the processor 62 in order to enable the various operations discussed herein. Additionally, the processor 62 may be in communication with the magnetic sensor 24 such that the controller 52 may utilize the magnetic field data to selectively activate the toll module 18.

In some embodiments, the toll module 18 may further be in communication with the vehicular device 22. The vehicular device 22 may similarly comprise the magnetic sensor 24 and may be operable to communicate the activation signal and the sleep signal to the toll module 18. Accordingly, the disclosure may provide for the toll module 18 to be activated in the active mode and the sleep mode based on a detection of the magnetic field data by the magnetic sensor 24 of the vehicular device 22. In this way, the disclosure may provide for a variety of configurations to provide for the beneficial operations of the toll module 18 discussed herein.

The controller 52 of the vehicular device 22 may further be in communication with a vehicle bus 66. In this configuration, the controller 52 may be operable to communicate with a number of vehicle systems (e.g. a navigation system, vehicle control module, speed sensors, etc.). Additionally, the controller 52 may be in communication with a display screen 68. The display screen 68 may comprise any form of video screen, for example a light emitting diode (LED) display, organic LED display, liquid crystal display (LCD), etc. In this configuration, the controller 52 may display various forms of image or video data on the display screen 68.

The magnetic sensor 24 may be implemented as any device operable to detect changes in a magnetic field proximate the toll module 18. For example, the magnetic sensor 24 may correspond to a magnetometer or various other analog or digital devices configured to detect a magnetic field. Further detailed descriptions of the vehicular device 22 configured to display a compass heading are described in commonly assigned U.S. Pat. Nos. 6,140,933; 6,968,273; 7,149,627; and 6,023,229, each of which is incorporated herein in its entirety.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

The invention claimed is:

1. A wireless communication module comprising:
    a magnetic sensor configured to detect magnetic field data;
    a communication circuit;
    a controller in communication with the magnetic sensor and the communication circuit, the controller configured to:
        monitor the magnetic field data;
        compare a change in the magnetic field data to a first predetermined threshold; and
        output an activation signal to the communication circuit in response to a change in the magnetic field data exceeding the first threshold;
    wherein the communication circuit is configured to enter an active state in response to receiving the activation signal, wherein the controller is further configured to output a sleep signal configured to cause the wireless communication module to enter a dormant state in response to the magnetic field data being less than a second predetermined threshold for a predetermined period of time while the wireless communication module is in the active state.

2. The device according to claim 1, wherein the controller is further configured to monitor the magnetic field data while the wireless communication module is in the active state.

3. The device according to claim 2, wherein the wireless communication module is configured to deactivate a scanning function configured to detect the wireless signal in response to the dormant state.

4. The device according to claim 1, wherein the first predetermined threshold and the second predetermined threshold correspond to changes in the magnetic field data identified by the controller.

5. The device according to claim 1, wherein the wireless communication module is configured to detect a wireless signal broadcast by an electronic toll reader in the active state, wherein the electronic toll reader is configured to apply a toll to an account associated with a vehicle.

6. The device according to claim 5, wherein the wireless communication module is configured to broadcast an identification code in response to detecting the wireless signal broadcast by the electronic toll reader.

7. A method for controlling a wireless communication module, the method comprising:
    monitoring magnetic field data in a plurality of axes;
    identifying a change in the magnetic field data;
    comparing the change in the magnetic field to a first predetermined threshold;
    activating a communication circuit to an active state in response to the change in the magnetic field data exceeding the first threshold;
    in response to the active state, scanning for one or more wireless signals at a frequency; and
    in response to the magnetic field being less than a second predetermined threshold for a predetermined period of time, deactivating a communication circuit to a dormant state causing the wireless communication module to deactivate the scanning for the one or more wireless signals.

8. The method according to claim 7, further comprising: detecting a first wireless signal in the active state; and
in response to detecting the first wireless signal, emitting a second wireless signal.

9. The method according to claim 8, wherein the first wireless signal comprises a request from a wireless payment module for an identification signal identifying an account associated with the wireless communication module.

10. The method according to claim 9, wherein the second wireless signal comprises the identification signal indicating the account associated with the wireless communication module.

11. The method according to claim 7, further comprising: monitoring the magnetic field data while the wireless communication module is in the active state.

12. The method according to claim 7, wherein the first predetermined threshold and the second predetermined threshold correspond to changes in the magnetic field data identified by the controller in one or more of the plurality of axes.

13. The method according to claim 7, wherein the wireless communication module is configured to detect a wireless signal broadcast by an electronic toll reader in the active state.

14. The method according to claim 13, wherein the wireless communication module is configured to broadcast an identification code in response to detecting the wireless signal broadcast by the electronic toll reader.

15. A wireless communication system for a vehicle, the system comprising:
a magnetic sensor configured to detect magnetic field data in a plurality of axes;
a communication circuit;
a controller in communication with the magnetic sensor and the communication circuit, the controller configured to:
monitor the magnetic field data;
compare a change in the magnetic field data to a predetermined threshold in an active state of the communication circuit; and
output a sleep signal to the communication circuit in response to the change in the magnetic field data being less than the predetermined threshold for a predetermined period of time, wherein the communication circuit is configured to enter a dormant state in response to receiving the sleep signal.

16. The system according to claim 15, wherein the communication circuit in the active state scans for a first wireless signal from an electronic toll reader, and wherein in response to the first wireless signal, the controller controls the communication circuit to transmit a second wireless signal.

17. The system according to claim 16, wherein the second wireless signal comprises an identification signal identifying an account associated with the wireless communication module.

* * * * *

UNITED STATES PATENT AND TRADEMARK OFFICE
CERTIFICATE OF CORRECTION

PATENT NO. : 10,271,278 B2
APPLICATION NO. : 15/816091
DATED : April 23, 2019
INVENTOR(S) : Geerlings It is certified that error appears in the above-identified patent and that said Letters Patent is hereby corrected as shown below:

In the Claims

Column 6, Line 37, Claim 3 "2" should read --1--.

Signed and Sealed this
Ninth Day of July, 2019

Andrei Iancu
*Director of the United States Patent and Trademark Office*